United States Patent [19]
Shizuhara

[11] 3,984,781
[45] Oct. 5, 1976

[54] BIAS CONTROL CIRCUIT FOR AN AUDIO AMPLIFIER UTILIZING AN UNSATURATED JUNCTION TYPE FET

[75] Inventor: Shuji Shizuhara, Akikawa, Japan

[73] Assignee: Sansui Electric Co., Ltd., Tokyo, Japan

[22] Filed: Dec. 22, 1975

[21] Appl. No.: 643,409

[30] Foreign Application Priority Data
Dec. 21, 1974 Japan.................... 49-155381[U]

[52] U.S. Cl................................. 330/35; 330/13; 330/15; 330/22; 330/40
[51] Int. Cl.².......................................... H03F 3/16
[58] Field of Search .................. 330/13, 15, 17, 22, 330/35, 40

[56] References Cited
UNITED STATES PATENTS
3,921,089  11/1975  Tsurushima..................... 330/35 X Primary Examiner—R. V. Rolinec
Assistant Examiner—Lawrence J. Dahl
Attorney, Agent, or Firm—Harris, Kern, Wallen & Tinsley

[57] ABSTRACT

A power amplifier is constituted by a complementary pair of one N channel and one P channel unsaturated junction type FET's constructing a single ended push-pull circuit, the N channel FET having a drain connected to the positive terminal of a first dc power source of a predetermined voltage and a source connected via a load to a ground potential, and the P channel FET having a drain connected to the negative terminal of the first dc power source and a source connected via the load to the ground potential. The gate potentials of the complementary pair of FETs constituting the power amplifier are controlled by a bias control circuit constructed of a complementary pair of one PNP type and NPN type bipolar transistors, the PNP type bipolar transistor having a collector coupled to the gate of the N channel FET and connected via a first resistor to the negative terminal of a second dc power source with its voltage predetermined and varied at substantially the same rate as that of the first dc power source and a base connected to the collector thereof via a second resistor, and the NPN type bipolar transistor having a collector coupled to the gate of the P channel FET and connected via a third resistor of the same resistance value as the first resistor to the positive terminal of the second dc power source and a base connected to the collector thereof via a fourth resistor of the same resistance value as the second resistor, the bases of the bipolar transistors being also interconnected via a common resistor and the emitters thereof being coupled in common to one terminal of an input audio signal source having the other terminal connected to the ground potential via respective resistors of the same resistance value, whereby the amounts of drain current flowing into the complementary pair of FET's are each maintained substantially constant, even if the voltage levels of the first and second dc power source are fluctuated.

9 Claims, 3 Drawing Figures

F I G. 2
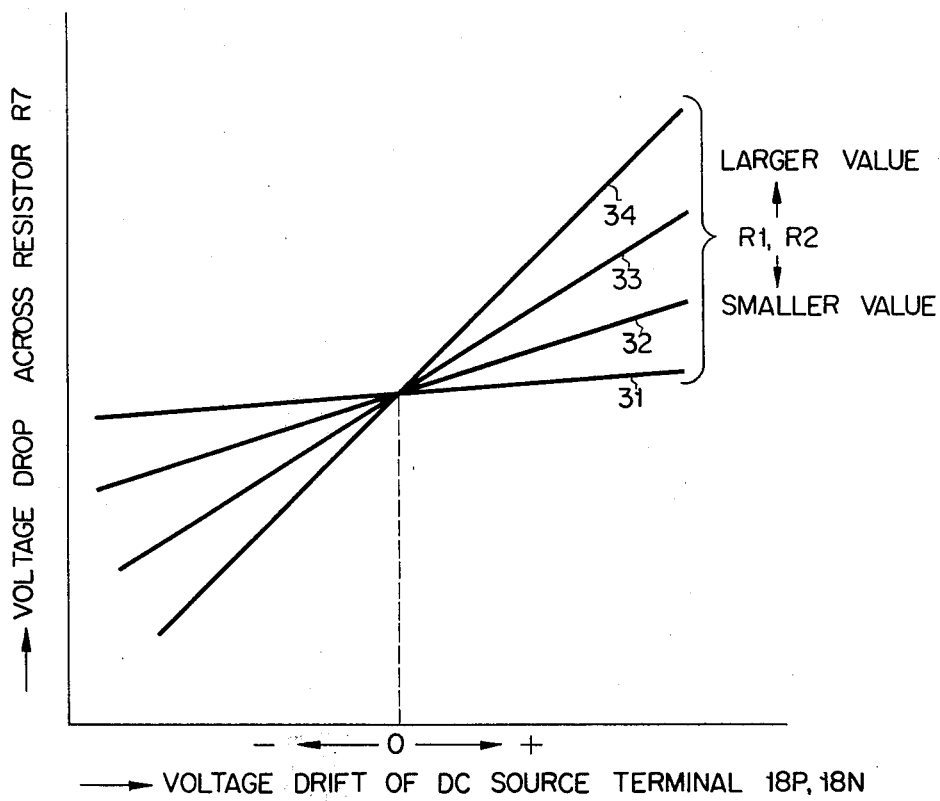

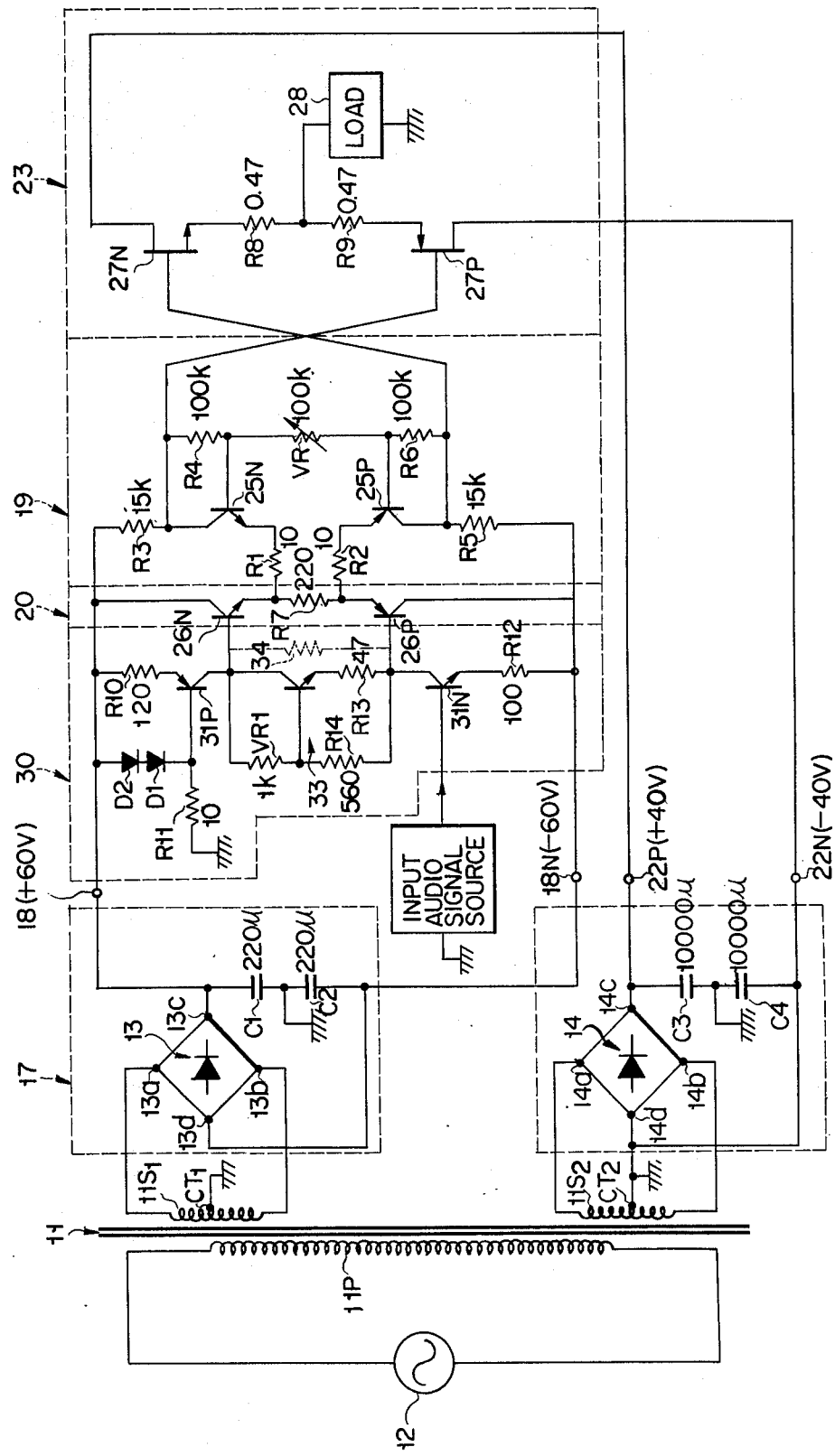
F I G. 3

BIAS CONTROL CIRCUIT FOR AN AUDIO AMPLIFIER UTILIZING AN UNSATURATED JUNCTION TYPE FET

BACKGROUND OF THE INVENTION

The present invention relates to a bias control circuit for an audio amplifier utilizing as an amplifier element a field effect transistor (hereinafter referred to as "FET"), more particularly, a vertical or unsaturated junction type FET.

In the field of an audio amplifier, there has recently been accepted the type which uses an unsaturated junction type FET as an active circuit element constituting its final or power amplifier stage. Namely, an unsaturated junction type FET is an active circuit element showing the so-called triode tube characteristic different from the prior art saturated type FET which indicates the so-called pentode tube characteristic. Therefore said unsaturated junction type FET has an excellent advantage in amplifying audio signals of a particularly large input level.

On the other hand, an unsaturated junction type FET has the disadvantage that the amount of its drain current $I_D$ varies with the drift of its drain-to-source voltage $V_{DS}$. Consequently, an audio amplifier containing an unsaturated junction type FET involves the problem that the amount of its drain current $I_D$ varies with its power supply voltage, even if its gate-to-source voltage $V_{GS}$ is kept at a constant value, resulting in the crossover distortion of a signal amplified by the FET as well as the undue increment of its temperature.

Accordingly, practical application of an audio amplifier containing an unsaturated junction type FET is primarily governed by the extent to which the drift of its drain current $I_D$ can be reduced with respect to the fluctuation of its power supply voltage.

Thus a counter measure hitherto adopted for an audio amplifier containing an unsaturated junction type FET to prevent the drift of its drain current $I_D$ with respect to the fluctuation of its power supply voltage is exemplified by one in which power sources for the driver stage (usually constituted by a bipolar transistor) and the final power amplifier stage formed of the FET are respectively constituted by constant voltage sources. From the technical as well as the economical viewpoint, it raises little problem that a power source for the driver stage consuming a relatively small amount of power is constituted by a constant voltage source. Where, however, a power source for the power amplifier stage consuming a maximum amount of power is constituted by a constant voltage source, then some technical difficulties arise in addition to the required use of expensive circuit elements of a large current capacity as the constituent elements of the constant voltage source.

For this reason, an audio amplifier utilizing an unsaturated junction type FET is desired to have such a circuit arrangement that the amount of drain current $I_D$ flowing into the FET can always be kept substantially constant, without employing a constant voltage source for the power amplifier stage including the FET, even if the level of its power supply voltage is fluctuated by any cause.

Such a circuit arrangement may include the type which enables the level of the gate-to-source potential $V_{GS}$ of the FET to drift at substantially the same rate as its drain-to-source voltage $V_{DS}$, even if the level of the power supply voltage is fluctuated. To provide a practical circuit arrangement for the above-mentioned object, those skilled in the art can readily think of a process of employing the power sources whose voltages always fluctuate at a substantially equal level for the driver and power amplifier stages, without utilizing constant voltage sources.

However, such a circuit arrangement can not yet maintain the drain current $I_D$ flowing into the FET at a constant value even if the levels of the power supply voltages are fluctuated. The reason is that voltage $V_{GS}$ applied between the gate and source of the FET varies at a higher level than that of voltage $V_{DS}$ impressed between the drain and source thereof due to the voltage amplification factor $\mu$ of the FET.

SUMMARY OF THE INVENTION

It is, therefore, the object of the present invention to provide a bias control circuit for an audio amplifier utilizing an unsaturated junction type FET capable of so controlling its gate-to-source potential or gate vias voltage as to enable the amount of drain current flowing thereinto always to maintain at a substantially constant value, even if the level of its power supply voltage is fluctuated.

According to the preferred embodiment of the invention there is provided a bias control circuit for an audio amplifier utilizing an unsaturated junction type FET, the improvement wherein said amplifier includes at least an amplifier section formed of a complementary pair of one N channel and one P channel unsaturated junction type FETs constituting a single ended pushpull circuit, the N channel FET having a drain connected to the positive terminal of a first dc power source of a predetermined voltage and a source connected via a load to a ground potential, and the P channel FET having a drain connected to the negative terminal of the first dc power source and a source connected via the load to the ground potential; and wherein said bias control circuit comprises a first complementary pair of one PNP type- and one NPN type-bipolar transistors, the first PNP type bipolar transistor having a collector coupled to the gate of the N channel FET and connected via a first resistor to the negative terminal of a second dc power source with its voltage predetermined and fluctuated at substantially the same rate as that of the first dc power source and a base connected to the collector thereof via a second resistor, and the first NPN type bipolar transistor having a collector coupled to the gate of the P channel FET and connected via a third resistor of the same resistance value as the first resistor to the positive terminal of the second dc power source and a base connected to the collector thereof via a fourth resistor of the same resistance value as the second resistor, the base of the bipolar transistors being also interconnected via a fifth common resistor and the emitters thereof being coupled in common to one terminal of an input audio signal source having the other terminal connected to the ground potential via sixth respective resistors of the same resistance value.

The bias control circuit constructed as above mentioned has the advantage capable of maintaining the amounts of drain current flowing into the complementary pair of FET's substantially constant, even if the levels of their drain-to-source voltages and those of their gate-to-source voltages drift with the first and second dc power sources.

BRIEF DESCRIPTION OF THE DRAWING

FIG. 2 shows curve diagrams illustrating the relationship between variations in the resistance values of the resistors R1 and R2 shown in FIG. 1 and those in the voltage drops across the resistor R7 shown therein; and FIG. 3 is a schematic circuit diagram according to another embodiment of the invention.

PREFERRED EMBODIMENTS OF THE INVENTION

Figure 1:
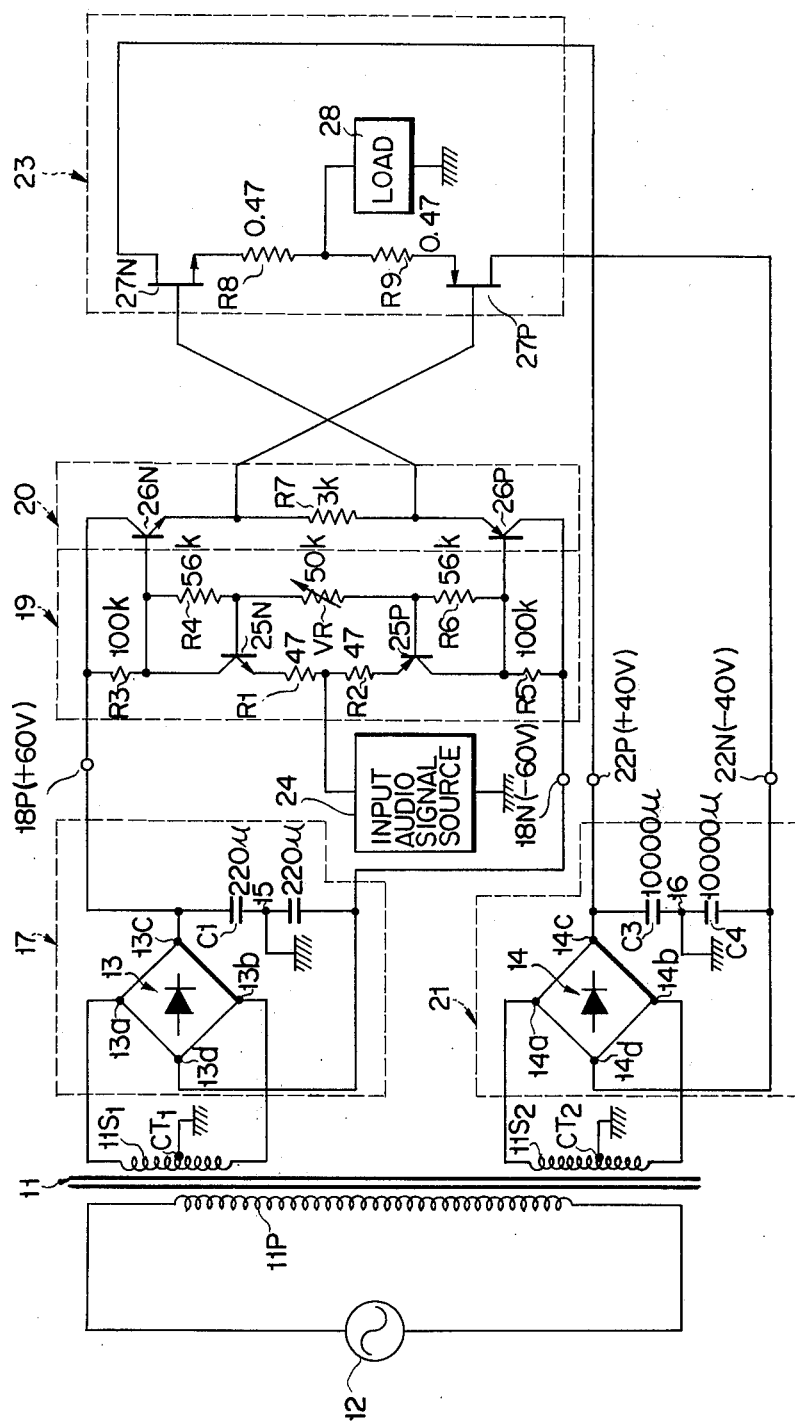
FIG. 1 is a schematic circuit diagram according to one embodiment of the invention.

A bias control circuit utilizing an unsaturated junction type FET according to the preferred embodiments of the invention will now be described by reference to the appended drawings.

FIG. 1 is a schematic circuit diagram according to one embodiment of the invention. In FIG. 1, reference numeral 11 denotes a power transformer comprising a primary winding 11P having two ends connected across an ac power source 12, and two secondary windings $11S_1$ and $11S_2$ electromagnetically coupled to the primary winding 11P and having their center taps $CT_1$ and $CT_2$ connected to a reference or ground potential, respectively. One, e.g., $11S_1$ of the secondary windings has two ends connected to the corresponding input terminals 13a and 13b of a full wave rectifier bridge 13. Thus, the rectifier bridge 13 is so constructed as to induce positive and negative dc voltages having a predetermined value, e.g., ±60 volts on its positive and negative output terminals 13c and 13d.

Similarly, the other secondary winding $11S_2$ has two ends connected to the corresponding input terminals 14a and 14b of a full wave rectifier bridge 14 with its positive and negative output terminals 14c and 14d designed to induce thereon positive and negative dc voltages of a predetermined value, e.g., ±40 volts. Two smoothing capacitors C1 and C2 are connected in series between the rectifier bridge output terminals 13c and 13d. The junction 15 of the capacitors C1 and C2 is connected to the ground potential. Similarly, two smoothing capacitors C3 and C4 are connected in series between the rectifier bridge output terminals 14c and 14d, the junction 16 of the capacitors C3 and C4 being connected to the ground potential.

Thus, a circuit portion 17 including the rectifier bridge 13 and the smoothing capacitors C1 and C2 acts to impress the aforesaid ± dc 60 volts on positive and negative dc power source terminals 18P and 18N connected respectively to the positive and negative output terminals 13c and 13d of the rectifier bridge 13, the positive and negative dc power source terminals 18P and 18N jointly constituting a dc power source for the later described bias control circuit 19 and driver circuit 20 respectively formed of two bipolar transistors.

On the other hand, a circuit portion 21 including the rectifier bridge 14 and the smoothing capacitors C3 and C4 functions to apply the aforesaid ± dc 40 volts to positive and negative dc power source terminals 22P and 22N connected respectively to the positive and negative output terminals 14c and 14d of the rectifier bridge 14, and jointly constituting a dc power source for the later described power amplifier circuit 23 formed of two unsaturated junction type FET's.

Thus, one terminal of a conventional input audio signal source 24 with the other terminal connected to the ground potential is connected to the emitters of a complementary pair of one NPN type and one PNP type bipolar transistors 25N and 25P jointly constituting the bias control circuit 19 via separate resistors R1 and R2 of the appropriate same resistance value, e.g., 47Ω.

The transistor 25N has a collector connected to the base thereof via a resistor R4 of a suitable resistance value, e.g., 56 kΩ and also to the positive dc power source terminal 18P via a resistor R3 of a predetermined resistance value, e.g., 100 kΩ.

Similarly, the transistor 25P has a collector connected to the base thereof via a resistor R6 of the same resistance value as the resistor R4 and also to the negative dc power source terminal 18N via a resistor R5 of the same resistance value as the resistor R3. The bases of the transistors 25N and 25P are interconnected via a variable resistor VR of an appropriate resistance value, e.g., 50 kΩ. Thus, the complementary pair of bipolar transistors 25N and 25P collectively constituting the bias control circuit 19 operate in a base grounded ac mode and in an emitter grounded dc mode. The collector of the transistor 25N is further connected to the base of an NPN type bipolar transistor 26N having a collector connected to the positive dc power source terminal 18P. Similarly, the collector of the transistor 25P is further connected to the base of a PNP type bipolar transistor 26P with its collector connected to the negative dc power source terminal 18N. The transistors 26N and 26P have their emitters interconnected via a common load resistor R7 of a preselected resistance value, e.g., 3 kΩ. Thus, the transistors 26N and 26P constitute a pair of mutually complementary emitter-follower circuits jointly forming the so-called single ended pushpull (hereinafter referred to as "SEPP") circuit used as the driver circuit 20.

The emitter of the transistor 26N is further connected to the gate of a P channel unsaturated junction type FET 27P having a drain connected to the negative dc power source terminal 22N.

Similarly, the emitter of the transistor 26P is further connected to the gate of an N channel unsaturated junction type FET 27N with its drain connected to the positive dc source terminal 22P. The FET's 27P and 27N have their sources connected via separate resistors R8 and R9 of the prescribed same resistance value, e.g., 0.47 Ω to one terminal of a load 28 such as a loudspeaker with the other terminal connected to the ground potential. Thus, the FET's 27P and 27N constitute a pair of mutually complementary source-follower circuits collectively forming a SEPP circuit used as the power amplifier circuit 23.

The operation of the circuitry of FIG. 1 will now be described. Assuming that the voltage level of the ac power source 12 is fluctuated by any cause, then those of the positive and negative dc voltages induced on the positive and negative dc source terminals 22P and 22N inevitably vary as apparent to those skilled in the art. As a result, the amounts of drain current flowing through the drain-source paths of the FET's forming the power amplifier circuit 23 tend to drift. At the same time, the positive and negative dc voltage levels induced on the positive and negative dc power source terminals 18P and 18N vary at substantially the same rate as those induced on the aforesaid dc source terminals 22P and 22N.

For this reason, the amounts of emitter current of the transistors 26N and 26P constituting the driver circuit 20 and in consequence their emitter potentials for defining the source-to-gate potentials $V_{GS}$ of the FET's 27P and 27N forming the power amplifier 23 drift with the polarities, thereby compensating changes in their drain current $I_D$. In this case, if the bias control circuit 19 is not provided, then the levels of the gate-to-source voltages $V_{GS}$ of the FET's 27P and 27N drift at substantially the same rate as those of the drain-to-source voltages thereof in accordance with variations in the voltage levels of the ac power source 12. If, however, the gate-to-source voltages $V_{GS}$ of the FET's 27P and 27N fluctuate in almost the same amount as their drain-to-source voltages $V_{DS}$ as above mentioned, then the aforesaid drift compensation for the drain current $I_D$ of the FET's 27P and 27N depending on their gate-to-source voltages $V_{GS}$ will be carried to the excess due to the voltage amplification factor $\mu$ of the FET's.

According to the present invention, the bias control circuit 19 is provided, offering the advantage that the drift of the drain current flowing into the FET's 27P and 27N can always be reduced to the smallest possible extent as described hereinunder, even if the voltage levels of the ac power source 12 is drifted. That is, the resistors R4 and R6 connected between the corresponding collectors and bases of the transistors 25N and 25P forming the bias control circuit 19 each act as a negative feedback resistance element as is well known in the art. Where, consequently, the dc voltage levels of the positive and negative dc power source terminals 18P and 18N vary with the voltage level of the ac power source 12, then the collector potentials of the transistors 25N and 25P so connected to the corresponding bases of the transistors 26N and 26P as to define the corresponding gate-to-source potentials $V_{GS}$ of the FET's 27P and 27N change in a smaller amount than the dc voltage levels induced on the positive and negative dc power source terminals 18P and 18N. For this reason, the present inventor has experimentally proved that the above-mentioned selection, as shown in FIG. 1, of the resistance values of the negative feedback resistors R4 and R6 used in the bias control circuit 19 enables the drain current flowing into the FET's 27P and 27N forming the power amplifier circuit 23 to be always maintained substantially constant, even if the voltage level of the ac power source 12 is fluctuated for any reason.

In this case, changes in the degree of the drift compensation of the collector potentials of the transistors 25N and 25P with respect to variations in the voltage level of the ac power source 12 can be most effectively attained by variations in the resistance values of their emitter resistors R1 and R2, but can also be controlled by variations in the resistance values of the negative feedback resistors R4 and R6 as well as of the collector resistors R3 and R5 of the transistors 25N and 25P. Where the resistance values of the emitter resistors R1 and R2 of the transistors 25N and 25P are variously changed, curves 31, 32, 33 and 34 shown in FIG. 2 respectively indicate the relationship between the drifts of the dc voltage levels induced on the positive and negative dc power source terminals 18P and 18N resulting from variations in the voltage level of the ac power source 12 and variations in the voltage drops induced across the common emitter resistor R7 of the transistors 26N and 26P and defining the gate-to-source potentials $V_{GS}$ of the FET's 27P and 27N. As apparent from these curves 31 to 34, the drifted amounts of the gate-to-source voltages $V_{GS}$ of the FET's 27P and 27N corresponding to those fluctuations in the dc voltage levels of the positive and negative dc power source terminals 18P and 18N which result from variations in the voltage level of the ac power source 12 are more reduced as the resistance values of the resistors R1 and R2 are progressively decreased. This means that the smaller the resistance values of the resistors R1 and R2, the less the drifted amounts of the collector potentials of the transistors 25N and 25P with respect to fluctuations in the dc voltage levels of the positive and negative dc power source terminals 18P and 18N.

The above-mentioned basic principle associated with variations in the resistance values of the resistors R1 and R2 can be equally applied to the negative feedback resistors R4 and R5 and also to the collector resistors R3 and R5 of the transistors 25N and 25P.

Hence, the transistors 25N and 25P forming the bias control circuit 19 each operate in a base grounded ac mode and in consequence each of their current amplification factors stands at about 1. For this reason, audio frequency signals supplied from the input audio signal source 24 to the emitters of the transistors 25N and 25P are transmitted through their collectors into the bases of the corresponding transistors 26N and 26P constituting the driver circuit 20, with substantially the same signal phase and level as when initially supplied, thereby enabling any audio frequency signal to be transmitted in a substantially original form through the bias control circuit 19 to the driver circuit 20.

According to the embodiment of FIG. 1, the resistor VR interconnecting the bases of the transistors 25N and 25P is of variable type. Therefore, the adjustment of the resistance value of the variable resistor VR has the merit of controlling the base bias potentials of the transistors 25N and 25P and in consequence controlling the gate-to-source potentials $V_{GS}$ of the FET's 27P and 27N defining the amounts of their drain current $I_D$.

FIG. 3 is a schematic circuit diagram according to another embodiment of the invention.

The embodiment of FIG. 3 differs from that of FIG. 1 in that; (a) the collectors of the transistors 25N and 25P forming the bias control circuit 19 are connected directly to the gates of the corresponding FET's 27P and 27N forming the power amplifier circuit 23 and the emitters of the transistors 25N and 25P are connected via the corresponding resistors R1 and R2 to the emitters of the corresponding transistors 26N and 26P forming the driver circuit 20, whereby the bias control circuit 19 is provided in the immediately preceding stage of the power amplifier circuit 23, i.e., between the driver circuit 20 and the power amplifier circuit 23; and an audio frequency signal delivered from the input audio signal source 24 is applied to the driver circuit 20 through a preamplifier circuit 30 of the hereinunder described construction. The preamplifier circuit 30 comprises three or one PNP type and two NPN type bipolar transistors 31P, 31N and 32N each having an emitter, a base and a collector respectively connected in the circuitry of FIG. 3 as hereinunder described.

The PNP type bipolar transistor 31P has a collector connected to the base of the transistor 26N included in the driver circuit 20, an emitter connected to the positive dc power source terminal 18P via a resistor R10 of an appropriate resistance value, e.g., 120 Ω, and a base connected to the dc power source terminal 18P via two series connected diodes D1 and D2 with their forward polarities and also to the ground potential via a resistor R11 of a preselected resistance value, e.g., 10 kΩ. The NPN type bipolar transistor 31N has a collector connected to the base of the transistor 26P included in the driver circuit 20, an emitter connected to the negative dc power source terminal 18N via a resistor R12 of a prescribed resistance value, e.g., 100 Ω, and a base connected to the nongrounded side terminal of the input audio signal source 24 with the other terminal connected to the ground potential. And the NPN type bipolar transistor 32N has a collector connected to the collector of the transistor 31P, an emitter connected to the collector of the transistor 31N via a resistor R13 of a predetermined resistance value, e.g., 47 Ω, and a base connected to the collector of the transistor 31P via a variable resistor VR1 of an appropriate resistance value, e.g., 1 kΩ and also to the collector of the transistor 31N via a resistor R14 of a preselected resistance value, e.g., 560 Ω.

A circuit portion 33 including the transistor 32N. constitutes, as is well known to those skilled in the art, a kind of constant current source with a temperature drift compensation effect and acts as a common collector load network for the transistors 31P and 31N. The circuit portion 33 may be replaced by a resistor having an appropriate resistance value and shown by phantom 34 in FIG. 3.

The parts of FIG. 3 corresponding to those of FIG. 1 are denoted by the same symbols and the description thereof is omitted.

It will be apparent that the circuitry of FIG. 3 constructed as above mentioned operates in a similar manner to, and can attain substantially the same effect as, that of FIG. 1. In this case, it will be easily understood by those skilled in the art that the most appropriate resistance value of each of the resistors R1 to R9 used in the circuitry of FIG. 3 differs from that of the circuitry of FIG. 1, due to different circuit arrangements.

While the invention has been described in term of the preferred embodiments, it should be understood that various changes and modifications will occur to those skilled in the art, without departing from the scope of the invention as defined in the appended claims.

What is claimed is:

1. A bias control circuit for an audio amplifier utilizing an unsaturated junction type FET, the improvement wherein said amplifier includes at least an amplifier section formed of a complementary pair of one N channel and one P channel unsaturated junction type FETs constituting a single ended pushpull circuit, the N channel FET having a drain connected to the positive terminal of a first dc power source of a predetermined voltage and a source connected via a load to a ground potential, and the P channel FET having a drain connected to the negative terminal of the first dc power source and a source connected via the load to the ground potential; and wherein said bias control circuit comprises a first complementary pair of one PNP type- and one NPN type-bipolar transistors, the first PNP type bipolar transistor having a collector coupled to the gate of the N channel FET and connected via a first resistor to the negative terminal of a second dc power source with its voltage predetermined and fluctuated at substantially the same rate as that of the first dc power source and a base connected to the collector thereof via a second resistor, and the first NPN type bipolar transistor having a collector coupled to the gate of the P channel FET and connected via a third resistor of the same resistance value as the first resistor to the positive terminal of the second dc power source and a base connected to the collector thereof via a fourth resistor of the same resistance value as the second resistor, the bases of the bipolar transistors being also interconnected via a fifth common resistor and the emitters thereof being coupled in common to one terminal of an input audio signal source having the other terminal connected to the ground potential via sixth respective resistors of the same resistance value.

2. The bias control circuit claimed in claim 1, wherein the first dc power source across which the drains of the complementary pair of FET's are connected and the second dc power source across which the collectors of the complementary pair of bipolar transistors are coupled each comprise a full wave rectifier bridge having its input terminals connected to the both ends of a secondary power transformer winding which is electromagnetically coupled to a primary power transformer winding having its terminals connected across an ac power source.

3. The bias control circuit claimed in claim 1, wherein the fifth resistor interconnecting the bases of the complementary pair of bipolar transistors is of variable type.

4. The bias control circuit claimed in claim 1, wherein there is further provided, between the collectors of the complementary pair of bipolar transistors having their emitters coupled via the sixth respective resistors to the input audio signal source and the gates of the complementary pair of FET's, a driver circuit comprising a second complementary pair of one NPN type and one PNP type bipolar transistors constituting a single ended pushpull circuit, the second NPN type bipolar transistor having a base connected to the collector of the first NPN type bipolar transistor, a collector connected to the positive terminal of the second dc power source and an emitter connected to the gate of the P channel FET, and the second PNP type bipolar transistor having a base connected to the collector of the first PNP type bipolar transistor, a collector connected to the negative terminal of the second dc power source and an emitter connected to the gate of the N channel FET, the emitters of the second bipolar transistors being further interconnected via a common resistor.

5. The bias control circuit claimed in claim 4, wherein the first complementary pair of bipolar transistors have their emitters directly connected to the one terminal of the input audio signal source, with the other terminal connected to the ground potential.

6. The bias control circuit claimed in claim 1, wherein there are further provided, between the sixth respective resistors connected to the corresponding emitters of the first complementary pair of bipolar transistors and the one terminal of the input audio signal source with the other terminal connected to the ground potential, a driver circuit comprising a second complementary pair of one NPN type and one PNP type bipolar transistors constituting a single ended pushpull circuit, the second NPN type bipolar transistor having an emitter connected via the sixth corresponding resistor to the emitter of the first NPN type bipolar transistor and a collector connected to the positive terminal of the second dc power source, and the second PNP type bipolar transistor having an emitter connected via the sixth corresponding resistor to the emitter of the first PNP type bipolar transistor and a collector connected to the negative terminal of the second dc power source, the second bipolar transistors having their bases interconnected via a seventh common resistor; and a preamplifier circuit comprising a third complementary pair of one PNP type and one NPN type bipolar transistors, the third PNP type bipolar transistor having a collector connected to the base of the second NPN type bipolar transistor, an emitter connected via an eighth resistor to the positive terminal of the second dc power source and a base coupled to a constant base bias voltage source, and the third NPN type bipolar transistor having a collector connected to the base of the second NPN type bipolar transistor, an emitter connected via a ninth resistor to the negative terminal of the second dc power source and a base coupled to the one terminal of the input audio signal source with the other terminal connected to the ground potential, the collectors of the third complementary pair of bipolar transistors being further interconnected via a common load resistance network.

7. The bias control circuit claimed in claim 6, wherein the common load resistance network inter connecting the collectors of the third complementary pair of bipolar transistors comprises a fourth NPN type bipolar transistor constituting a constant current source and having a collector connected to the collector of the third PNP type bipolar transistor, an emitter connected via a tenth resistor to the collector of the third NPN type bipolar transistor, and a base connected to the collector thereof via an eleventh resistor and also to the collector of the third PNP type bipolar transistor via a twelfth resistor.

8. The bias control circuit claimed in claim 6, wherein the common load resistance network interconnecting the collectors of the third complementary pair of bipolar transistors comprises a single resistance element.

9. The bias control circuit claimed in claim 6, wherein the gates of the complementary pair of FET's are connected directly to the corresponding collectors of the first complementary pair of bipolar transistors.

* * * * *